United States Patent [19]

Wern

[11] 4,289,972
[45] Sep. 15, 1981

[54] TOUCH CONTROL SWITCH

[76] Inventor: Lars A. Wern, Upplandsgatan 65, 113 28 Stockholm, Sweden

[21] Appl. No.: 6,251

[22] Filed: Jan. 24, 1979

Related U.S. Application Data

[63] Continuation-in-part of Ser. No. 885,806, Mar. 13, 1978, Pat. No. 4,210,822.

[30] Foreign Application Priority Data

Aug. 5, 1977 [SE] Sweden .................................. 7708952
Aug. 4, 1978 [SE] Sweden .................................. 7800026

[51] Int. Cl.$^3$ ............................................ H03K 17/68
[52] U.S. Cl. ..................................... 307/116; 307/157; 315/362
[58] Field of Search .................... 307/252 H, 116, 157; 340/332, 565; 315/362; 328/5

[56] References Cited

U.S. PATENT DOCUMENTS 3,811,054  5/1974  Wern .............................. 340/332 X
4,159,473  6/1979  Senk ............................... 307/116 X

FOREIGN PATENT DOCUMENTS 1395158  5/1975  United Kingdom .
1408116  10/1975  United Kingdom .

Primary Examiner—L. T. Hix
Assistant Examiner—James L. Dwyer
Attorney, Agent, or Firm—Hubbell, Cohen, Stiefel & Gross

[57] ABSTRACT

A touch control switch suitable for fluorescent lighting, or reactive load, as well as incandescent lighting, or resistive load, installations without modification to the control circuit. The control circuit is connected between the lamp load, either resistive or reactive, and the supply circuit in the lighting installation for alternating current and comprises a semiconductor switching element, such as a TRIAC, having a gate electrode. A counting circuit with a forward stepping input and a digital control output is connected to the gate electrode of the TRIAC via a trigger pulse generating circuit for controlling the conduction of the TRIAC in accordance with the condition of activation of the digital control output. A control pulse shaping circuit has its output connected to the forward stepping input of the counting circuit and first and second input terminals connectable to a touch sensitive impedance, such as a manually controllable capacitive reactance, to enable turn on or activation of the lamp load. The aforementioned trigger pulse generating circuit comprises an edge-triggered mono-pulse generating circuit that has a first input for leading edge triggering and a second input for trailing edge triggering jointly connected to the supply circuit.

14 Claims, 2 Drawing Figures

TOUCH CONTROL SWITCH

CROSS-REFERENCE TO RELATED APPLICATIONS

This is a continuation-in-part of application Ser. No. 885,806, filed Mar. 13, 1978, now U.S. Pat. No. 4,210,822. This application is related to my previous U.S. Pat. No. 3,811,054, entitled "Manually Operated Switch", issued May 14, 1974, naming Carl Rune Wern, George Herman Wern and myself as joint inventors, and is an improvement thereon.

BACKGROUND OF THE INVENTION

1. Field of the Invention

The invention relates to touch control circuits, and particularly touch control switches for use in controlling AC lighting installations having either reactive or resistive lamp loads.

2. Prior Art Statement

Touch control circuits, such as for use in controlling AC lighting installations, are well known, such as described in my previous U.S. Pat. No. 3,811,054, or in U.S. Pat. Nos. 3,666,988; 3,679,910; 3,805,096 or 3,857,100. None of these prior art control systems, with the exception of my previous U.S. Pat. No. 3,811,054, discloses a system which is essentially immune to line voltage drops in the line while also being essentially immune to external interference, is capable of operating over a wide AC voltage range without requiring a change in circuit components, and is also self-trimming so as to compensate for variations in reactance due to both touch wire length as well as variations in the body reactance of the person operating the switch. For example, U.S. Pat. Nos. 3,679,910 and 3,666,988 are both subject to the antenna effect and are not flexible in that they are dependent on a particular voltage and a particular touch wire length. With respect to my previous U.S. Pat. No. 3,811,054, although the touch control circuit disclosed therein is quite satisfactory for many purposes, such as for use with resistive lamp loads, it still requires modification for use with inductive lamp loads and has a higher non-load power dissipation than that of the present invention. Moreover, the touch control circuit of the present invention is more readily susceptible to monolithic circuit integration than my previous U.S. Pat. No. 3,811,054. In this regard, it is the entire touch control circuit which should preferably be the subject of monolithic circuit integration and not merely a component part, such as, for example, the type of conventional counter control circuitry disclosed in U.S. Pat. No. 2,851,596.

The above disadvantages of the prior art are overcome by the improvements of the present invention.

SUMMARY OF THE INVENTION

Figures 1, 2:
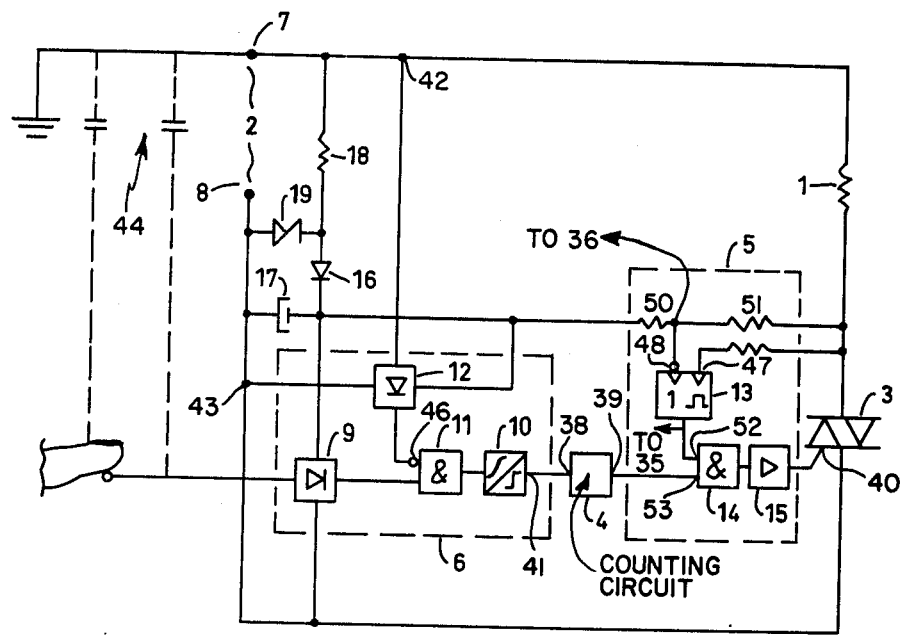
FIG. 1 is a block diagram, partially in schematic, of the presently preferred embodiment of the improved touch control switch circuit in accordance with the present invention, which invention is an improvement on my U.S. Pat. No. 3,811,054.
FIG. 2 is a schematic diagram of the touch detecting clipper stage portion of the switch circuit of FIG. 1.

The present invention is an improvement on my previous U.S. Pat. No. 3,811,054 and is suitable for controlling AC lighting installations having either reactive loads, such as fluorescent lighting, or resistive loads, such as incandescent lighting, without modification to the control circuit. This touch control switch is connected between the lamp load and a supply circuit in the AC lighting installation and comprises a semiconductor switching element, such as a TRIAC, having a gate electrode. A counting circuit with a forward stepping input and a digital control output is connected to the gate electrode of the semiconductor switching element via a trigger pulse generating circuit for controlling the conduction of the semiconductor switching element in accordance with the condition of activation of the digital control output. A control pulse shaping circuit has its output connected to the forward stepping input of the counting circuit and first and second input terminals connectable to first and second terminals, respectively, of the supply circuit via a touch sensitive impedance, such as a manually controllable capacitive reactance, to enable turn on or activation of the lamp load. This control circuit is responsive to power drops in the line while being essentially immune to external interference and is self-trimming so as to compensate for variations in reactance due to both touch wire length as well as variations in the body reactance of the person operating the switch.

DETAILED DESCRIPTION OF THE PREFERRED EMBODIMENT

Referring now to the drawings in detail, FIG. 1 shows the improved touch control switch of the present invention whose principal function and operation is substantially as described in my previous U.S. Pat. No. 3,811,054, with the exceptions to be noted in detail herein which provide the improvements herein, such as the ability to control both reactive and resistive loads in AC lighting installations without circuit modification. The improved touch control switch is preferably interconnected between a lamp load 1, illustratively shown as a resistive load although it could just as well be a reactive load, and a supply circuit 2 in an AC lighting installation. The touch switch preferably comprises a semiconductor switching element 3 having a gate electrode, such as the illustrated TRIAC. The touch switch preferably further comprises a counting circuit 4 having a forward stepping input 38 and a digital control output 39 which is preferably connected to the gate electrode 40 of the semiconductor switching element 3 via a trigger pulse generating circuit 5 for controlling the conduction of the semiconductor switching element 3 in accordance with the condition of activation of the digital control output 39. The touch control switch also preferably includes a control pulse shaping circuit 6 having an output 41 connected to the forward stepping input 38 of the counting circuit 4 and a pair of input terminals 42, 43 connected, respectively, to a pair of terminals 7, 8 of the supply circuit 2 via a touch sensitive external capacitive reactance 44 which is illustratively shown as being manually controllable.

The control pulse shaping circuit 6 preferably comprises a touch detecting clipper stage 9 which, as will be described in greater detail with reference to FIG. 2, preferably includes a peak value detector 45 and an adding circuit 21, with one input of the adding circuit 21 preferably being operatively connected to the control input 22 of the control pulse shaping circuit 6, and with the other input of the two input adding circuit 21 preferably being connected to the output of the peak value detector 45. As shown and preferred in FIG. 1, the output 41 of the control pulse shaping circuit 6 is preferably operatively connected to the output of the touch detecting clipper stage 9 via a pulse counting circuit 10 and a conventional AND circuit 11. The inhibiting input 46 of AND circuit 11 is preferably connected to the supply circuit 2 via a second clipper stage 12 whose circuit configuration is preferably identical with that of the touch detecting clipper stage 9, with the purpose of clipper stage 12, however, being to inhibit a malfunction of the type which can be caused by false control pulses occurring as a consequence of a voltage rise or surge in the supply circuit 2 such as caused by, for example, a disconnection of electric ovens from the line.

In the presently preferred touch control switch embodiment of the invention the trigger pulse generating circuit 5 preferably comprises a conventional two input mono-stable flip-flop 13 having one input 47 connected for leading edge triggering and the other input 48 connected for trailing edge triggering. These inputs 47, 48 are preferably jointly connected to the supply circuit 2 in shunt with the semiconductor switching element 3 and in series with the lamp load 1 in order to be controlled by the current through this load 1 which, as previously mentioned, can be a resistive load, such as an incandescent lamp, or a reactive load, such as a fluorescent lamp with a phase compensating capacitor. The connection of the trailing edge triggering input 48 of the mono-stable flip-flop 13 to the supply circuit 2 is preferably provided via a resistive voltage divider comprising resistances 50, 51 in which a shunt link is preferably connected to a biasing potential in order to provide a symmetrical triggering for the positive and negative half periods of the alternating current through the lamp load 1. Preferably, the mono-stable flip-flop 13 is of the C-MOS type, in which the aforementioned biasing potential is the supply voltage $V_{DD}$ of the flip-flop 13 and the aforementioned resistance of the shunt link is substantially half the value of the resistance of the series link in the aforementioned voltage divider 50, 51.

The aforementioned trigger pulse generating circuit 5 also preferably comprises a conventional two input AND circuit 14 having one input 52 connected to the output of the mono-stable flip-flop 13 and the other input 53 connected to the digital control output 39 of the counting circuit 4. The output of AND circuit 14 is preferably connected to the gate electrode 40 of the semiconductor element or TRIAC 3 via a driver stage 15. This driver stage 15 preferably supplies a trigger pulse when a predetermined voltage has been built up over the semiconductor element or TRIAC 3. The duration of this trigger pulse can preferably be very short as compared with the duration of the half period of the alternating current, for example 100 μs and 10 ms, respectively, thereby enabling the non-load power dissipation of the presently preferred touch control switch to be brought down to a very low value since the demand on its supply of current to the aforementioned control circuitry pertaining to the semiconductor element or TRIAC 3 will be modest.

This supply of current to the control circuitry in the presently preferred touch control switch is preferably provided via a rectifier diode 16, a smoothing capacitor 17, and a voltage dropping resistor 18 for a zener diode 19. The non-load power dissipation of the presently preferred touch control switch is thus substantially equal to the power dissipation of the voltage dropping resistor 18 and can, in the presently preferred embodiment of the present invention, be kept, for example, below ½ watt at 240 VAC while driving a TRIAC capable of supplying 2.5 A.

Referring to FIG. 2, the touch detecting clipper stage 9 is shown in greater detail in an embodiment which is readily suited for monolithic integration together with the above described trigger pulse generating circuit 5 and the majority of the other elements of the presently preferred touch control switch. As shown and preferred in FIG. 2, a pair of conventional two input voltage comparators 20, 21 (the aforementioned adding circuit) have a respective signal input jointly connected to the control input 22 of the touch detecting clipper stage 9 via a protection circuit consisting of a resistor 23 and a capacitor 24. The other respective reference input of comparators 20, 21 are preferably jointly connected to the output of the comparator 20 via the aforementioned peak value detector 45 which preferably includes a rectifier diode 25, a capacitor 26, a charge resistor 27 and a discharge resistor 28 keyed by a switching diode 29, as will be explained below in greater detail. The aforementioned connection of the signal input of the comparator 21 to the control input 22 of the touch detecting clipper stage 9 is preferably provided via a resistive voltage divider consisting of a series resistor 30 and a shunt resistor 31. As was previously mentioned, this voltage comparator 21 constitutes the above mentioned adding circuit which preferably has an output 32, with a current feeding resistor 33 preferably being connected to the output of the clipper stage 9.

The sensitivity of the preferred touch detecting clipper stage 9 is inversely proportional to the attenuation in the above mentioned resistive voltage divider 30, 31 which can, with a maintained margin to a generation of false control pulses, be reduced in an inverse proportion to an increase of the time constants for charge and discharge in the above mentioned peak value detector 45. The charge time constant of peak value detector 45 must, in any case, be considerably greater than the period time of the alternating current in the supply circuit 2, whereas the resistance of the discharge resistor 28 in peak value detector 45 can, however, be considerably smaller than the resistance of the charge resistor 27 thanks to the fact that discharge resistor 28 is keyed by the switching diode 29 which preferably conducts only during a very short time interval of the period of the alternating current in the supply circuit 2 corresponding to the duration of the trigger pulse for the negative half period applied to the semiconductor element 3. This switching diode 29 is preferably connected to the output of a conventional two input AND circuit 34 which has a signal input 35 arranged to be connected to the output of the mono-stable flip-flop 13 shown in FIG. 1 and an inhibiting input 36 arranged to be connected to the trailing edge triggering input of this mono-stable flip-flop 13.

If desired, the circuit structure of the clipper stage 9 previously described with reference to FIG. 2 can be modified without departing from the spirit and scope of the present invention. For example, the rectifier diode 25 and the switching diode 29 may be replaced with conventional analog MOS-gates having low leakage currents. In addition, the series resistor 30 may be replaced by a direct wire connection and a negative biasing of the signal input of the voltage comparator 21 relative to its reference input.

It should be noted that preferably the function of the clipper stage 9 illustrated in FIG. 2 corresponds to the function of the clipper stage described in the above mentioned U.S. Pat. No. 3,811,054, the contents of which are specifically incorporated by reference herein in their entirety, although clipper stage 9 herein works with a lower signal voltage and with larger tolerances in the circuit resistors, which makes it more readily suited for monolithic integration. In order to insure a correct signal processing in the AND circuit 11 and in the conventional pulse counting stage 10, it is imperative that variations in the external capacitance on the input of the touch detecting clipper stage 9 only influence the phase position of the control pulses supplied from this stage 9 to a small extent, if at all. This is preferably accomplished by preferably selecting the resistance of all the resistors 23, 30 and 31 considerably lower than the reactance of the capacitor 24 whose capacitance, in turn, is preferably selected to be substantially equal to the maximum external capacitance, such as for example 500 pF. In addition, the input of the clipper stage 9 can preferably be provided with a shunt circuit with a variable attenuation produced, for example, by means of a field effect transistor controlled by the voltage over the capacitor 26 of the peak value detector 45 in a known manner such as is described in Electronics, Vol. 50, No. 7, pp. 107. Thus, a constant ratio between a varying external series reactance and a shunt resistance varying proportionally thereto in the input circuitry of the clipper stage 9 is then obtained and results in the phase position of the control pulses being supplied from the clipper stage 9 being maintained constant relative to the phase of the alternating current in the supply current 2. This makes it possible for the AND circuit 11 and the clipper stage 12 to increase the margin in inhibiting false control pulses produced as a consequence of voltage transients in the supply circuit 2.

It should be noted that unless otherwise described herein, all of the individual circuit components are conventional and are, therefore, not described in any greater detail than necessary for one of ordinary skill in the art to understand the functioning of the overall unique combination of these components in the presently preferred touch control switch.

What is claimed is:

1. A touch control switch connectable between a lamp type load and an AC power supply in an AC type of lighting installation for controlling said load in response to touch, said touch control switch comprising gating means trigger pulse generating means operatively connected to said gating means for changing the state thereof, pulse counting means operatively connected to the input of said trigger pulse generating means for controlling the state of said gating means in accordance with the output of said pulse counting means, touch sensitive impedance means, and control pulse shaping means having its input operatively connected to said power supply through said touch sensitive impedance means and its output operatively connected to the input of said pulse counting means, said trigger pulse generating means having a leading edge triggering input and a trailing edge triggering input with said triggering inputs being operatively connected in parallel to said power supply, said touch sensitive impedance means varying said impedance in response to touch for initiating trigger pulse generation from said trigger pulse generating means for changing said gating means state to activate said load, said load being capable of comprising both a reactive type load and a resistive type load.

2. A touch control switch in accordance with claim 1 wherein said gating means comprises a semiconductor type switch means having a gate electrode with said gate electrode being operatively connected to said trigger pulse generating means for control thereby in response to a change in the impedance of said touch sensitive impedance means.

3. A touch control switch in accordance with claim 2 wherein said semiconductor type switch means comprises a TRIAC.

4. A touch control switch in accordance with claim 3 wherein said mono-pulse generating means comprises a flip-flop.

5. A touch control switch in accordance with claim 2 wherein said mono-pulse generating means comprises a flip-flop.

6. A touch control switch in accordance with claim 2 wherein said counting means has a forward stepping input and a digital control output connected to said gate electrode through said trigger pulse generating means for controlling the conduction of said semiconductor type switch means in accordance with the condition of activation of said digital control output.

7. A touch control switch in accordance with claim 6 wherein said control pulse shaping means has its output connected to the forward stepping input of said counting means.

8. A touch control switch in accordance with claim 6 wherein said operative parallel connection of said inputs of said mono-pulse generating means is arranged with said inputs in shunt with the semiconductor type switch means and in series with said lamp type load.

9. A touch control switch in accordance with claim 6 wherein said mono-pulse generating means comprises a mono-stable flip-flop.

10. A touch control switch in accordance with claim 9 wherein said mono-stable flip-flop is a C-MOS type flip-flop.

11. A touch control switch in accordance with claim 10 further comprising a resistive voltage divider means having a shunt link operatively connected to the supply voltage $V_{DD}$ of said flip-flop, said trailing edge triggering input being operatively connected to said power supply through said resistive voltage divider means, the resistance of said shunt link being substantially half the value of the resistance of the series link in said voltage divider, whereby symmetrical triggering for the positive and negative half periods of the alternating current is provided.

12. A touch control switch in accordance with claim 11 further comprising an AND means having a signal input operatively connected to the output of said mono-pulse generating means and an inhibiting input operatively connected to said voltage divider means jointly with said trailing edge triggering input in said trigger pulse generating means, the output of said AND means being operatively connected to said control pulse shaping means for keying a reset link of a memory portion thereof.

13. A touch control switch in accordance with claim 1 wherein said load comprises a reactive type load.

14. A touch control switch in accordance with claim 1 wherein said load comprises a resistive type load.

* * * * *